United States Patent [19]

Hasegawa et al.

[11] 4,354,199

[45] Oct. 12, 1982

[54] SEMICONDUCTOR LIGHT-EMITTING DEVICE

[75] Inventors: Osamu Hasegawa; Kenji Yano, both of Kawasaki; Koichi Kaneda, Tokyo, all of Japan

[73] Assignee: Fujitsu Limited, Kawasaki, Japan

[21] Appl. No.: 182,587

[22] Filed: Aug. 29, 1980

[51] Int. Cl.³ .................. H01L 31/12; H01L 33/00
[52] U.S. Cl. ................................. 357/19; 357/16; 357/17; 357/30; 357/55
[58] Field of Search ............ 357/30, 88, 16, 55, 357/19, 17

[56] References Cited

U.S. PATENT DOCUMENTS

| | | | |
|---|---|---|---|
| 3,790,853 | 2/1974 | Pankove | 357/88 X |
| 4,117,504 | 9/1978 | Maslov et al. | 357/30 X |
| 4,191,593 | 3/1980 | Cacheux | 357/30 X |
| 4,294,510 | 10/1981 | Chappell | 357/30 X |

Primary Examiner—Martin H. Edlow
Attorney, Agent, or Firm—Staas & Halsey

[57] ABSTRACT

A semiconductor light-emitting device comprising a semiconductor substrate of GaAs and a crystal layer of $Ga_{1-x}Al_xAs$ formed by epitaxial growth on the semiconductor substrate. The x value in the crystal layer is gradually decreased in accordance with the development of the epitaxial growth. A light ray emitted from a light-emitting portion in the crystal layer is bent in accordance with the distribution of the x value, so that the light ray can reach a light-emitting surface of the crystal layer. According to the invention, a groove is provided on the surface of the crystal layer so that the light-launching efficiency is increased over that of the prior art.

21 Claims, 23 Drawing Figures

SEMICONDUCTOR LIGHT-EMITTING DEVICE

BACKGROUND OF THE INVENTION

This invention relates to a semiconductor light-emitting device, and more particularly to a light-emitting diode (LED), preferably used for optical communication, in which the launching efficiency, that is, the ratio of the quantity of radiation transferred through an optical fiber to the total quantity of radiation emitted from the light-emitting portion of the LED, is increased.

In general, since the refractive index of crystal material used for fabricating an LED is very high, the critical angle at a plane surface of the crystal, that is, the minimum angle for total reflection, is very small. Therefore, only a small quantity of light emitted from the LED can be obtained outside the crystal. For example, when the crystal is made of $Ga_{1-x}Al_xAs$ at a refractive index of about 3.6, the critical angle is about 16°, and thus, only 1.4% of the light emitted from the LED is obtained outside the crystal. Moreover, if an optical fiber for receiving the light emitted from the LED is of a plane-ended type, only incident rays within a acceptance angle on the plane-ended surface can be coupled into the fiber. Therefore, only about 2 percent of the divergent rays emitted from the plane surface of the crystal is coupled into the fiber.

In order to increase the quantity of rays coupled into an optical fiber, a so-called spherical-ended fiber, the end of which is manufactured as a sphere, is used. However, there is a problem in that such a spherical-ended fiber is expensive. Also, in order to increase the quantity of rays coupled into the spherical-ended fiber, it is necessary to match the position of spherical end with the emitting surface of the LED, within an accuracy of several micrometers. However, it is very difficult to do so, especially when LEDs are arranged in an array. The term "launching efficiency" used hereinafter is defined as the ratio of the incident optical power coupled into a fiber to the optical power generated in an LED.

SUMMARY OF THE INVENTION

An object of the present invention is to provide an LED in which the launching efficiency is improved.

Another object of the present invention is to provide an LED which can emit parallel light rays for good coupling to a plane-ended optical fiber.

Still another object of the present invention is to provide an array of LEDs which can easily be arranged to couple to plane-ended optical fibers.

According to the present invention, there is provided a semiconductor light-emitting device comprising a semiconductor substrate, a $GA_{1-x}Al_xAs$ crystal layer formed by epitaxial growth on the semiconductor substrate, the x value in the crystal layer being gradually decreased as the epitaxial growth progresses, a light-emitting portion formed in a portion where the x value is minimum in the crystal layer, and a light-launching surface at a side surface of the crystal layer, a light ray emitted from the light-emitting portion being bent in accordance with the distribution of the x value to reach the light-launching surface, characterized in that the semiconductor substrate comprises a groove formed on the semiconductor substrate.

BRIEF DESCRIPTION OF THE DRAWINGS

The foregoing objects and other objects as well as the characteristic features of the invention will become more apparent and more readily understandable from the following description with reference to the accompanying drawings, in which like reference characters and numerals designate the same or similar parts throughout the figures and wherein.

DESCRIPTION OF THE PREFERRED EMBODIMENTS

Figures 1A, 1B:
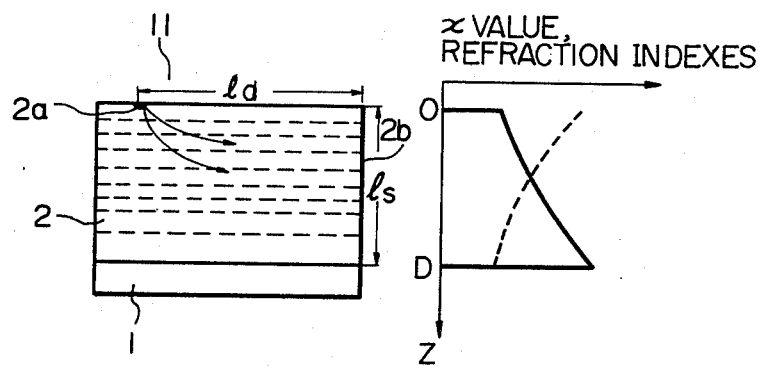
FIG. 1A is a general side view of an LED.
FIG. 1B illustrates the distributions of the x values and the refractive indices along the thickness of the LED, for explaining the principle of the present invention.

In the present invention, the following phenomenon is used: when a crystal layer of $Ga_{1-x}Al_xAs$ is grown by liquid-phase epitaxial growth, the x value is decreased, and therefore the refractive index is increased, in accordance with the increase of the thickness of the crystal layer. Therefore, when light is emitted at a point in the crystal layer where the x value is minimum, that is, at a point where the refractive index is maximum, the emitted light ray is bent in the crystal layer because the distribution of the refraction indexes is not uniform in the crystal layer. This phenomenon will easily be understood from FIGS. 1A and 1B. FIG. 1A is a general side view of an LED for explaining the principle of the present invention. Referring to FIG. 1A, an LED 11 is comprised of a substrate 1 of GaAs and a crystal layer of $Ga_{1-x}Al_xAs$ having a thickness of about 30 through 60 μm. The crystal layer is manufactured by liquid-phase epitaxial growth. By this epitaxial growth, the x values in the crystal layer 2 are different dependent on the positions in the crystal layer 2. The dotted lines in FIG. 1A represent equi-index lines of refraction. The distribution of the x values with respect to the depth of the crystal layer 2 is illustrated in FIG. 1B by a solid curve. As illustrated in FIG. 1B, the x value is increased in accordance with the increase of the depth. Also, the refractive indices vary with respect to the depth of the crystal layer 2. As illustrated in FIG. 1B by a dotted curve, the refractive index is decreased along with the increase of the depth. When light is emitted from a light-emitting portion 2a (FIG. 1A) at the uppermost portion of the crystal layer 2, a part of light rays initially directed toward the substrate 1 is bent, so that these rays are launched from a light-launching surface 2b. The distance between the light-emitting portion 2a and the light-launching surface 2b is about 50 to 100 micrometers. By using this phenomenon, the launching efficiency, which is the ratio of the quantity of light launched from a light-emitting device to the total quantity of light generated in the light-emitting device, can be improved.

The principle of improving the launching efficiency will now be explained with reference to FIGS. 2 through 5.

Figure 2:
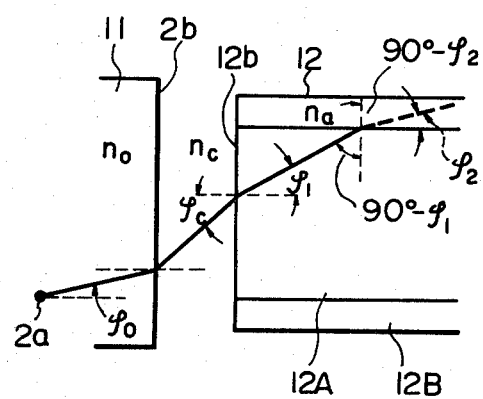
FIG. 2 illustrates a trace of a light ray launched from an LED and incident upon an optical fiber, for explaining the launching efficiency when the refractive index in the LED is uniform.

FIG. 2 illustrates a trace of a light ray launched from an LED and incident upon an optical fiber, for explaining the launching efficiency when the refractive index in the LED is constant. Referring to FIG. 2, an optical fiber 12 of a step-index type faces the LED 11. The optical fiber 12 is comprised of a core 12A and a cladding 12B. The refractive index of the LED 11 in FIG. 2 is constant and represented as $n_0$. The refractive indices of the core 12A and the cladding 12B are $n_1$ and $n_2$, respectively. The refractive index of the medium between the LED 11 and the fiber 12 is $n_c$. The incident angle at the side surface 2b is $\phi_0$. The angle of refraction at the light-launching surface 2b, which is equal to the angle of incident at the incident surface 12b of the fiber 12, is $\phi_c$. The angle of refraction at the incident surface 12b of the core 12A of the fiber 12 is $\phi_1$. The angle of incidence at the boundary surface between the core 12A and the cladding 12B is, therefore, $90° - \phi_1$. The angle of refraction at the boundary surface is $90° - \phi_2$. According to the Snell's law, the following expressions (1) and (2) are obtained.

$$n_1 \cos \phi_1 = n_2 \cos \phi_2 \quad (1)$$

$$n_c \sin \phi_c = n_1 \sin \phi_1 \quad (2)$$

In order to transfer a light ray through the core 12A of the fiber 12, the light ray must be reflected at the boundary surface. The critical angle $\phi_1$max of the angle $\phi_1$ is obtained by substituting $\phi_2 = 0°$ for the angle $\phi_2$ in the expression (1) and can be expressed as:

$$\phi_1 \text{max} = \sin^{-1}(NA/n_1) \quad (3)$$

The critical angle $\phi_c$max of the angle $\phi_c$ is obtained by substituting $\phi_1$max for the angle $\phi_1$ in the expression (2) and can be expressed as:

$$\phi_c \text{max} = \sin^{-1}(NA/n_c) \quad (4)$$

In the expressions (3) and (4), NA represents the numerical aperture and is expressed as:

$$NA = \sqrt{n_1^2 - n_2^2} \quad (5)$$

An incident-light ray from the medium into the core 12A of the fiber 12 can be transferred through the core 12A if the incident angle is smaller than the critical angle $\phi_c$max. At the side surface 2b, also according to the Snell's law, the following expression (6) is obtained.

$$n_0 \sin \phi_0 \text{max} = n_c \sin \phi_c \text{max} \quad (6)$$
$$= n_1 \sin \phi_1 \text{max}$$

Therefore, the critical angle $\phi_0$max of the angle of incidence at the light-launching surface 2b can be expressed as:

$$\phi_0 \text{max} = \sin^{-1}(NA/n_0) \quad (7)$$

As can be seen from the expression (7), the critical angle $\phi_0$max does not depend on the refractive index $n_c$ of the medium.

The launching efficiency $\eta$, which is the ratio of the quantity of radiation transferred through the core 12A of the fiber 12 to the total quantity of radiation emitted from the light-emitting portion of the LED, can be defined as the ratio of the solid angle of the critical angle $\phi_0$max, which is equal to $2\pi(1 - \cos\phi_0 \text{max})$, to the total solid angle $4\pi$. Therefore, the launching efficiency $\eta$ can be expressed as:

$$\eta = \frac{1 - \sqrt{1 - (NA/n_0)^2}}{2} \quad (8)$$

For example, when the value of NA is equal to 0.16, which is the practical value when the cladding 12B is made of pure quartz having the refractive index $n_2$ equal to 1.453, and when the refractive index $n_0$ of the LED 11 is a constant value of 3.55, the critical angle $\phi_0$max is equal to 2.58° and the launching efficiency is equal to 0.000507. Even when a totally reflecting surface is employed in the conventional LED, the launching efficiency $\eta$ is increased to a value of 0.001016, which is only twice the above mentioned value of 0.000507. Accordingly, 99.9% of the quantity of light emitted from the light-emitting portion of the LED can not be incident into the optical fiber.

Figure 3:
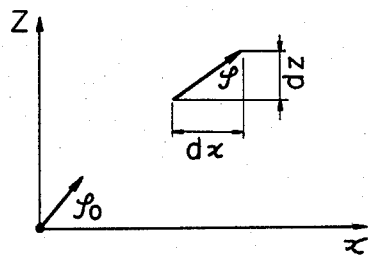
FIG. 3 is a diagram illustrating the assumption that the x value depends only on the position within the thickness dimension of the LED.

Now, let it be assumed that the refractive index n in the crystal layer of an LED and, accordingly, the x value of the crystal layer, are dependent only on the positions within the thickness of the crystal layer. Referring to FIG. 3, the abscissa indicates the x value, and the ordinate indicates the position Z within the thickness of the crystal layer. When a light ray is emitted from the light-emitting portion having the refractive index $n_0$ in the LED, with an initial angle $\phi_0$ between the radiated direction and the transverse direction crossing at right angles to the direction of the thickness, the angle $\phi$ of the light ray varies depending on the position Z. The angle $\phi$ can be expressed as:

$$\cos\phi = \frac{dx}{\sqrt{(dx)^2 + (dz)^2}} \quad (9)$$

According to Snell's law, the expression (10) is obtained.

$$n_0 \cos\phi_0 = n \cos\phi \quad (10)$$

From the expressions (9) and (10), the relations:

$$n_0\cos\phi_0 = \frac{ndx}{\sqrt{(dx)^2 + (dz)^2}} \quad (11)$$

and then $$(dz/dx)^2 + 1 = n^2/n_0^2 \cos^2\phi_0 \quad (12)$$

are obtained. Therefore, $d^2Z/dx^2$ can be expressed as:

$$\frac{d^2Z}{dx^2} = \frac{1}{2\cos^2\phi_0} \cdot \frac{d(n^2)}{n_0^2 dZ} \quad (13)$$

Let it be assumed that:

$$d(n^2)/n_0^2 dz = -g \text{ (constant)} \quad (14)$$

then, the light-path equation (13) can be expressed as:

$$Z = (-gx^2/4 \cos^2\phi_0) + x \tan\phi_0 \quad (15)$$

Figure 4:
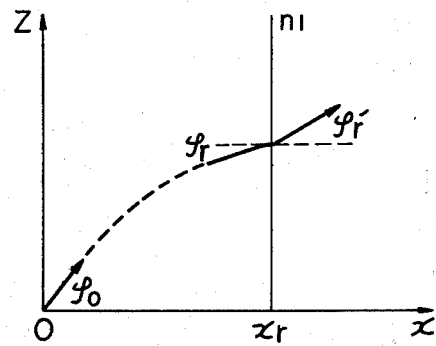
FIG. 4 is a diagram for explaining the relation between the incident angle and the refractive angle when light is transferred from the LED to the fiber.

Therefore, the light path becomes a parabolic trace as illustrated in FIG. 4.

Referring to FIG. 4, it is assumed that the light-launching surface 2b of the crystal layer 2 (FIG. 1) is in contact with the core 12A having the refractive index $n_1$ at a position where $X = X_r$. Then, the angle of incidence $\phi_r$ and the angle of refraction $\phi_r'$ at the boundary surface can be expressed as:

$$\tan\phi_r = \left(\frac{dz}{dx}\right)_{x=x_r} = \frac{-gx_r}{2\cos^2\phi_0} + \tan\phi_0, \quad (16)$$

and $$\sin\phi_r' = \frac{n}{n_1}\sin\phi_r = \frac{n_0}{n_1}\left(\frac{-gx_r}{2\cos^2\phi_0} + \sin\phi_0\right) \quad (17)$$

respectively. For the purpose of transferring the light ray through the core 12A, it is necessary to fulfill the following condition which can be obtained by taking into account the afore-mentioned expression (3).

$$|\sin\phi_r'| < NA/n_1 \quad (18)$$

Therefore, from the expressions (17) and (18), it is necessary to fulfill the following condition for transferring the light ray through the core 12A.

$$\left|\frac{-gx_r}{2\cos^2\phi_0} + \sin\phi_0\right| < \frac{NA}{n_0} \quad (19)$$

Figure 5A:
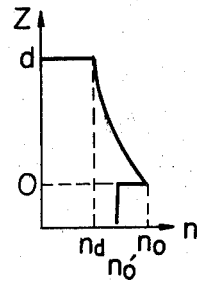
FIG. 5A is a diagram illustrating the distribution of refractive indexes across the thickness of the LED.

Now, let it be assumed that the thickness of the crystal layer 2 is d and, at the position $Z = d$, the crystal layer 2 is in contact with a light-absorbing medium such as GaAs substrate 1 (FIG. 1). Further, at the position $Z = 0$, the crystal layer 2 is in contact with a light-reflecting medium having a refractive index $n_0'$ lower than the refractive index $n_0$ at the light-emitting portion 2a of the crystal layer 2. Then, a distribution of the refractive index n with respect to the position Z of the LED is obtained, as illustrated in FIG. 5A. Referring to FIG. 5A, the refractive index is $n_0'$ where Z is negative, that is, in the light-reflecting medium. The refractive index varies from $n_0$ to $n_d$ according to the change of position from zero to d. The refractive index is zero where Z is larger than d, that is, in the light-absorbing medium.

Among the light rays emitted with a radiative angle $\phi_0$ which satisfy the expression (19), the light rays which fulfill the expression:

$$Z = (-gx^2/4 \cos^2\phi_0) + x \tan\phi_0 < d \ (0 < x < x_r) \quad (20)$$

can reach the boundary surface between the side surfaces of the crystal layer 2 and the core 12A before the light rays collide against the surface of the light-absorbing medium. In order to fulfill the expression (20), the discriminant of the quadratic equation:

$$(gx^2/4 \cos^2\phi_0) - x \tan\phi_0 + d = 0 \quad (21)$$

must be negative. Therefore, the relation:

$$\sin^2\phi_0 < gd$$

can be obtained. When the angle $\phi_0$ is positive, the expression:

$$\sin\phi_0 < \sqrt{gd} \quad (22)$$

is obtained.

By substituting the values $n_o$, $n_d$, and d for practical values of 3.55, 3.3 and 50 micrometers, respectively, $\phi_0\text{max}$ can be determined as:

$$\phi_0\text{max} = 10.62°$$

Also, by substituting the value $\phi_0$ in the expression (19) for the above practical value of 10.62°, and by assuming that NA in the expression (19) is equal to 0.16, the maximum length of the crystal layer 2 in the transverse direction is:

$$X_r\text{max} = 100.71 \text{ micrometers}$$

If the length of the crystal layer is larger than the maximum length $X_r$max, the radiation angle $\phi_0$ must be larger than the maximum radiation angle $\phi_0$max in order for the emitted light ray to reach the light-launching surface 2b before the light ray collides against the light-absorbing surface.

Figure 6:
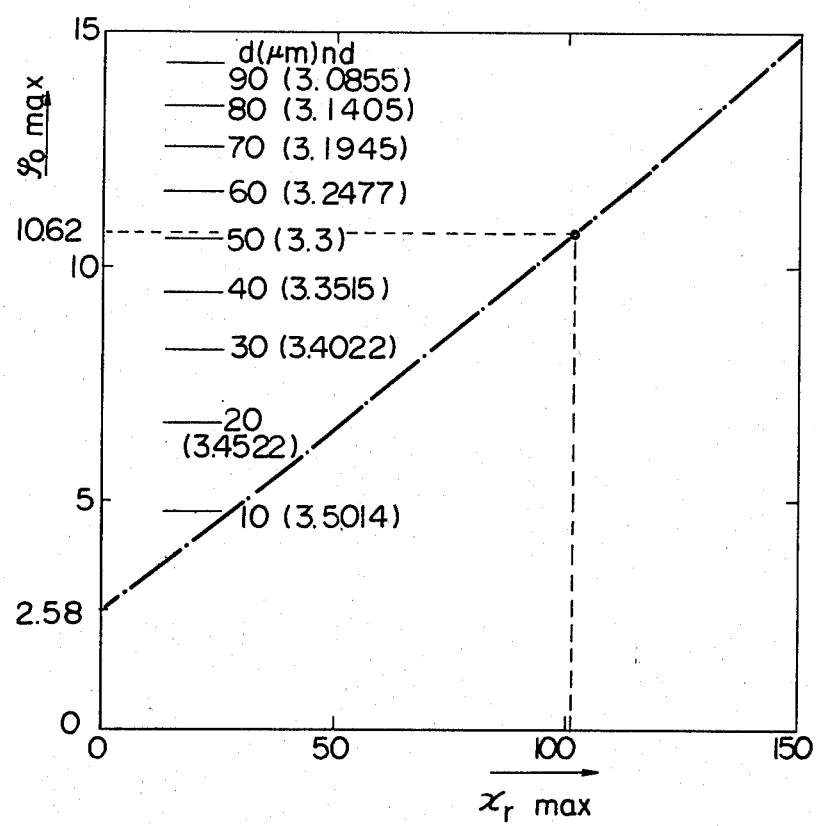
FIG. 6 is a graph illustrating the relation between the maximum radiation angle $\phi_0 max$ and the maximum length Xrmax of the length between the light-emitting portion and the light-launching surface.

FIG. 6 is a graph illustrating the relation between the maximum radiation $\phi_0$max and the maximum length $X_r$max, under the conditions that the numerical aperture NA is equal to 0.16 and the refractive index $n_0$ is equal to 3.55. For example, when the thickness d is 50 micrometers, the refractive index $n_d$ is 3.3, the maximum radiation angle $\phi_0$max is 10.62° and the maximum length $X_r$ is 100.71 micrometers, as illustrated by a dotted line. For the other values of thickness, such as d=20, 30, 40, 60, 70, 80 or 90 micrometers, the corresponding values of $n_d$, $\phi_0$max and $X_r$max can be determined in a similar way by using FIG. 6.

It should be noted that the maximum radiation angle $\phi_0$max of 10.62° in the condition of the expression (14) is about four times larger than the maximum radiation angle $\phi_0$max of 2.58° in the condition that the refraction index $n_0$ is constant in the crystal layer.

Figure 5B:
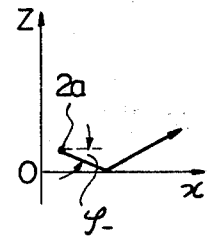
FIG. 5B is a diagram illustrating a path of a light ray in the LED.

Among the light rays emitted at a point near the point Z=0, the light rays with a negative radiation angle $-\phi$ collide againt the boundary surface of the light-reflecting medium with the refraction index $n_0'$, as illustrated in FIG. 5B. In order to totally reflect the light rays emitted with a radiation angle $-\phi$ larger than the angle $-\phi_0$max at the boundary surface, the refractive index $n_0'$ must fulfill the condition:

$$n_0' < n_0 \cos \phi_0\text{max} \quad (23)$$

When the above-mentioned practical values are applied to the expression (23), the refractive index $n_0'$ is smaller than the value 3.489. The light-reflecting surface may be made of evaporated metal.

Figure 7:
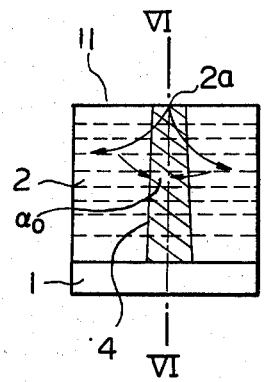
FIG. 7 illustrates the light-launching surface of the LED of FIG. 1A.
Figure 8:
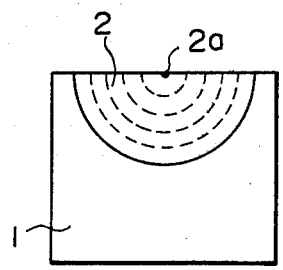
FIG. 8 illustrates an ideal structure of a cross section of an LED for obtaining a large launching efficiency.

Although the maximum radiation angle $\phi_0$max, and thus the launching efficiency $\eta$, are increased by utilizing the distribution of the refraction indices in the crystal layer of the LED, the quantity of light launched from the light-launching surface 2b is limited to as small as illustrated in FIG. 7 by slashed lines, if the positions of the same refractive index constitute a plane parallel to the surface of the substrate. FIG. 7 illustrates the light-launching surface 2b of the LED 11 of FIG. 1A. In FIG. 7, dotted lines parallel to the surface of the substrate 1 represent equi-index lines of refraction. Referring to FIGS. 1A and 7, the surfaces of equi-index of refraction are parallel to the surface of the substrate. Because of this fact, among the light rays emitted from the light emitting portion 2a toward the substrate 1, only a small quantity of light can reach the light-launching surface 2b. The light rays which can reach the side surface 2b are those emitted at an angle within a critical angle $\alpha_0$ between the vertical line VI—VI and a side 4 of a triangle forming the slashed area. The other light rays emitted at an angle larger than the critical angle $\alpha_0$ can not reach the light-launching surface 2b. Therefore, by the structure of the LED illustrated in FIG. 7, the launching efficiency is limited. An ideal structure for obtaining large launching efficiency is illustrated in FIG. 8. As illustrated in FIG. 8 by dotted lines, the equi-index lines of refraction should be concentric in the ideal structure. However, it is difficult to manufacture the crystal layer 2 so as to have such concentric equi-index lines of refraction.

According to the present invention, a groove is formed on the surface of the substrate so that the equi-index surfaces of refraction become similar to concentric surfaces.

Figure 9:
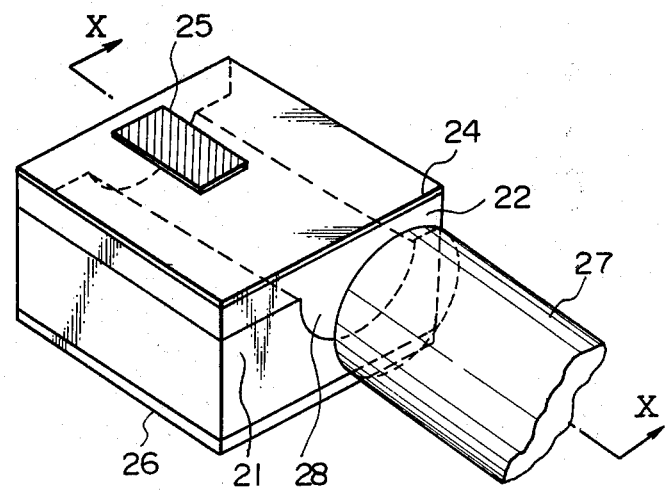
FIG. 9 is a perspective view of an LED according to the first embodiment of the present invention.

FIG. 9 illustrates a perspective view of an LED according to the first embodiment of the present invention. Referring to FIG. 9, the LED of this first embodiment comprises an n-type GaAs substrate 21 and an n-type $Ga_{1-x}Al_xAs$ crystal layer 22 formed on the substrate 21. According to the present invention, a groove 28 having a cross section of a half circle is formed on the surface of the substrate 21. The groove 28 extends from the rear surface to the light-launching surface. The crystal layer 22 is formed by epitaxial growth on the groove 28, so that the x values are gradually decreased in accordance with the increase of the thickness of the crystal layer 22. An insulating film 24, such as silicon dioxide, is formed on the crystal layer 22. A positive electrode 25 is formed through a contact window formed in the insulating film 24. A negative electrode 26 is formed under the GaAs substrate 21. An optical fiber 27 is abutted to a light launching surface of the LED.

Figure 10:
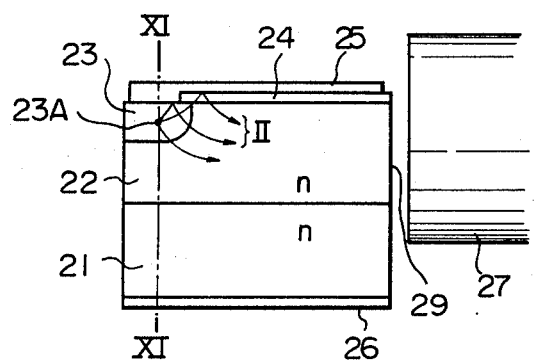
FIG. 10 is a cross-sectional view taken along the line X—X of FIG. 9.

FIG. 10 is a cross-sectional view taken along the line X—X of FIG. 9. Referring to FIG. 10, a p-type impurity diffusion region 23 is formed by diffusing zinc in a part of the upper portion of the crystal layer 22. A light-emitting portion 23A is provided in the region 23. The light rays emitted from the light-emitting portion 23A toward the substrate 21 are bent due to the distribution of refractive indices, and a part of the light rays are incident through the light-launching surface into the optical fiber 27. The light rays emitted from the light-emitting portion 23A toward the insulating film 24 are reflected by the electrode 25 (see light paths II). When the insulating film 24 is made of transparent material, total reflection mainly occurs at the surface of the electrode 25.

Figure 11:
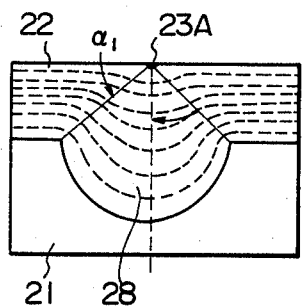
FIG. 11 is a partial cross-sectional view taken along the line XI—XI of FIG. 10.

FIG. 11 illustrates a partial cross-sectional view taken along the line XI—XI of FIG. 10. Referring to FIG. 11, the groove 28 at the top surface of the substrate 21 has a cross section of a half circle. The dotted lines represent equi-index lines of refraction. Due to the structure of the groove 28, the equi-index lines of refraction are similar to concentric circles. Therefore, the light rays which can reach the launching surface 29 are those emitted at an angle within a critical angle $\alpha_1$ as illustrated in FIG. 11. The angle $\alpha_1$ is much larger than the angle $\alpha_0$ in FIG. 7. Therefore, according to this first embodiment, the launching efficiency is greatly increased in comparison with the example of FIG. 7. The launching efficiency $\eta_1$ obtained by this first embodiment is 0.00428, which is 4.2 times as large as the conventional launching efficiency of 0.001016.

Figure 12:
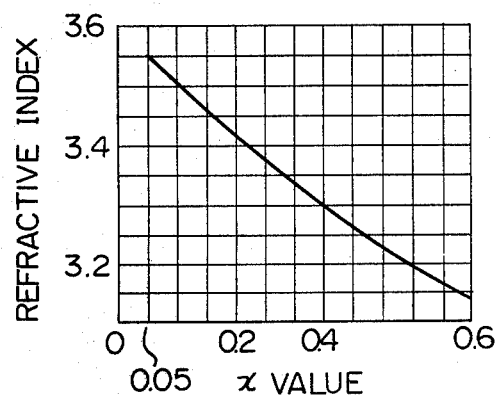
FIG. 12 is a graph illustrating the relation between the refractive index and the x value.

FIG. 12 is a graph illustrating the relation between the refractive index and the x value for a light ray with a wave length of 0.812 micrometer, in the $Ga_{1-x}Al_xAs$ crystal layer 22 used in this first embodiment. For a wave length of 0.85 micrometer, the minimum x value is nearly equal to 0.05. The minimum x value nearly corresponds to the energy gap for transferring the light ray. Therefore, a region having an x value lower than 0.05 is not transparent for light rays. As illustrated in FIG. 12, refractive indices decrease according to the increase of x values.

Figure 13:
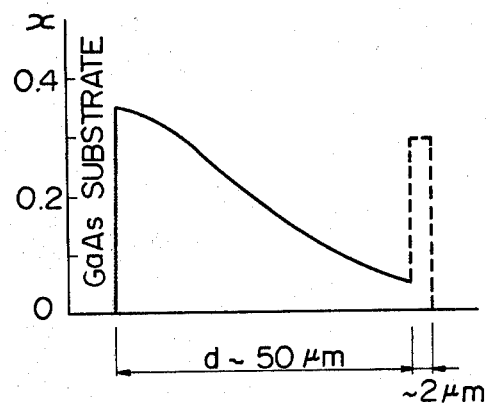
FIG. 13 is a graph illustrating the best mode of the distribution of x values with respect to the depth of the crystal layer.

FIG. 13 is a graph illustrating the best mode of the distribution of x values with respect to the depth of the crystal layer 22. The $Ga_{1-x}Al_xAs$ crystal layer 22 is formed on the GaAs substrate 21 by liquid-phase epitaxial growth under the condition that the speed of decreasing the temperature of the crystal is 0.3° C. per minute, the starting temperature for the epitaxial growth is 900° C., and the time duration for the epitaxial growth is 3.5 hours. By this epitaxial growth, the crystal layer 22 is grown to have a thickness of about 50 micrometers. The distance between the light-emitting portion 23A and the launching surface 29 (FIG. 10) is preferably about 100 micrometers. Since the segregation factor of AlAs is larger than that of GaAs, the quantity of aluminum in the gallium solution, and therefore, the x value, is decreased in accordance with the development of the epitaxial growth. As illustrated in FIG. 13 the decrease in the x value is smaller in a shallow area of the crystal layer 22 than in a deep area. Therefore, the distribution curve of the x value with respect to the depth of the crystal layer 22 is similar to a parabolic curve. Since the x value is linearly proportional to the refractive index as illustrated in FIG. 12, the distribution curve of the refractive indexes is also similar to a parabolic curve. The distribution curve similar to the parabolic curve corresponds to the parabolic trace of the light path illustrated in FIG. 4.

As illustrated in FIG. 13 by dotted lines, by growing another layer, with a thickness of about 2 micrometers, on the top surface of the crystal layer 22 after the crystal layer 22 has been grown, the added layer can be used as a reflection layer. The added layer is also used as a layer for trapping injected carriers during the operation of the LED.

Figure 14:
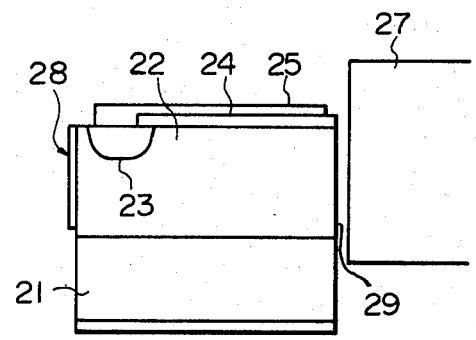
FIG. 14 is a general side view of an LED according to the second embodiment of the present invention.

FIG. 14 is a general side view of an LED according to the second embodiment of the present invention. The structure of this LED is quite similar to that of the LED of the first embodiment. The only difference between FIG. 10 and FIG. 14 is that, in FIG. 14, a reflecting film 28 is provided on the basic surface opposite to the light-launching surface 29 of the crystal layer 22, so that the luanching efficiency is increased by two times over the first embodiment. The launching efficiency $\eta_2$ obtained by the LED of this second embodiment is 0.00856, which is 8.4 times as large as the conventional launching efficiency of 0.001016.

Figure 15:
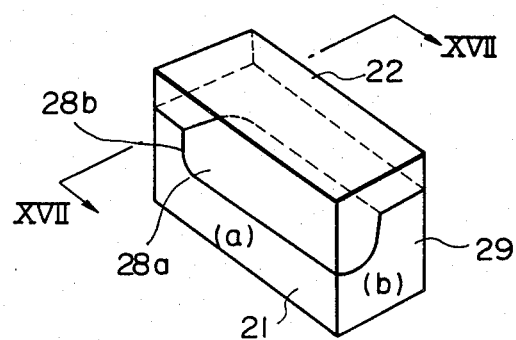
FIG. 15 is a partial perspective view of an LED according to the third embodiment of the present invention.

FIG. 15 is a partial perspective view of an LED according to the third embodiment of the invention. Referring to FIG. 15, the structure of this LED is almost the same as that of the LED of FIG. 10. The only difference between FIG. 10 and FIG. 15 is that, in FIG. 15, a groove 28a terminates with a curved surface 28b, before the groove 28a reaches the back side surface opposite the light launching surface 29. By this structure, the equi-index surfaces of refraction of the $Ga_{1-x}Al_xAs$ crystal layer 12 formed on the groove 28a are similar to the curved surfaces 28b.

Figure 16:
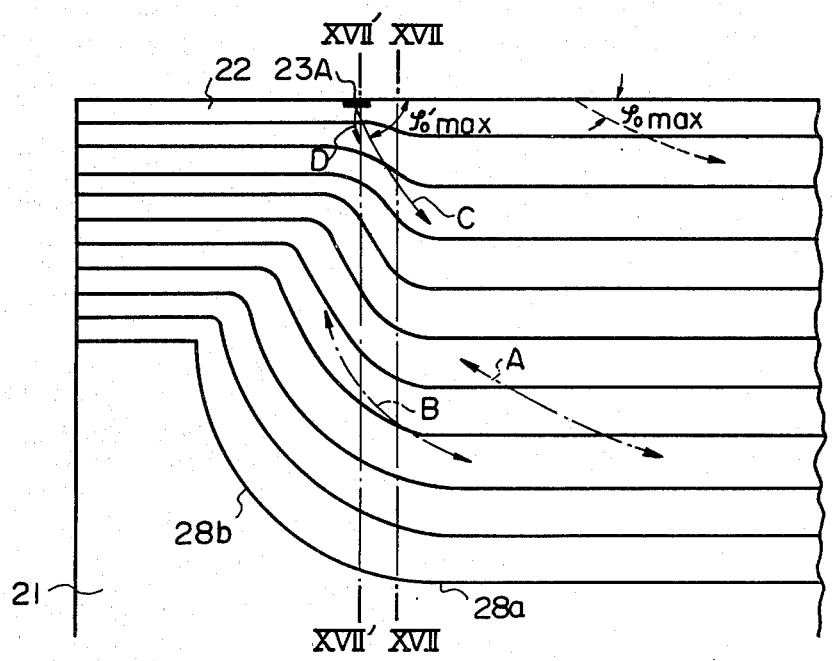
FIG. 16 is a schematic diagram illustrating equi-index lines of refraction when seen from the cross section (a) of FIG. 15.

FIG. 16 is a schematic diagram illustrating equi-index lines of refraction, when seen from the cross section (a) of FIG. 15. Referring to FIG. 16, the equi-index lines are curved along the curved surface 28b of the groove 28a. Therefore, a light path B in the area where the equi-index lines are curved is bent more than a light path A in the area where the equi-index lines are parallel to each other. In order to increase the maximum radiation angle $\phi_0 max$, the light-emitting portion 23A is preferably formed at the top surface of the crystal layer 22 and at the portion near the curved surface 28b of the end of the groove 28a, as illustrated in FIG. 16. The maximum radiation angle, when the light-emitting portion 23A is formed at the above mentioned position, is represented by $\phi'_0 max$, which is larger than the maximum radiation angle $\phi_0 max$ when the light-emitting portion 23A is formed at a portion where the equi-index lines are parallel.

Figure 17:
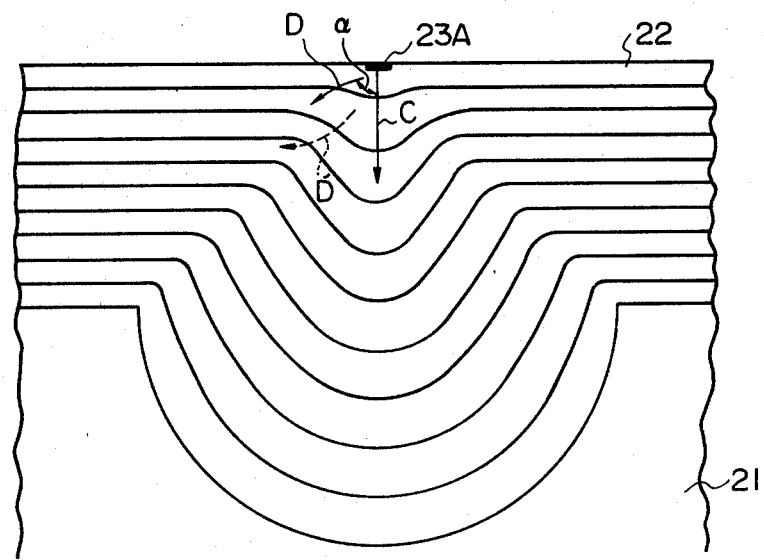
FIG. 17 is a schematic diagram illustrating equi-index lines of refraction when seen from the cross section taken along the line XVII—XVII of FIG. 16.

FIG. 17 is a schematic diagram illustrating equi-index lines of refraction when seen from the cross section taken along the line XVII—XVII of FIG. 16. Referring to FIGS. 16 and 17, a light ray C emitted downward from the light-emitting portion 23A is bent toward the light-launching surface 29 (FIG. 15). If a cross section is taken along the line XVII'—XVII' the density of the equi-index lines becomes higher than the density as illustrated in FIG. 7. Therefore, a light ray D emitted in a direction having a transverse component is bent so that the transverse component is decreased. If the groove 28a extends throughout the surface of the substrate 21, such as in the aforementioned first and second embodiments, the light rays are bent so as to be parallel to the equi-index surfaces of refraction, as illustrated in FIG. 17 by a dotted line D'. Therefore, according to this third embodiment, light rays are bent more sharply than in the first and second embodiments, in which the groove has no end, resulting in an improved launching efficiency.

The present invention is not restricted to the foregoing embodiments and many other modifications are possible. For example, although the groove has a cross section of a half circle in the foregoing preferred embodiments, alternatively, the cross section may have any shape, such as a shape of a half ellipse, V-shape, a trapezoid, etc.

Figure 18:
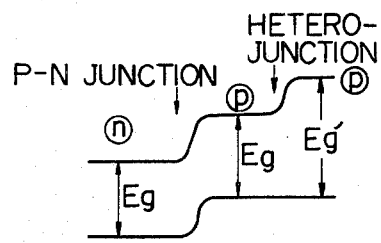
FIG. 18 is a schematic diagram illustrating energy levels of a diffused-type single heterostructure.
Figure 19:
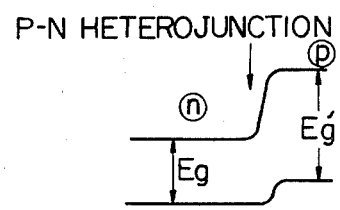
FIG. 19 is a schematic diagram illustrating energy levels of a grown-junction type single heterostructure.

Although a p-n junction is utilized for the light-emitting portion 23A in the foregoing embodiments, alternatively, a heterojunction, such as a diffused-type single heterostructure or a grown junction type single heterostructure, may be utilized. FIG. 18 is a schematic diagram illustrating energy levels of the diffused-type single heterostructure. As will be seen from FIG. 18, electrons injected from a p-n junction in a p-type region are prevented from diffusing by a heterojunction. The quantity of holes injected into the n-type region is increased by decreasing the distance between the p-n junction and the heterojunction. FIG. 19 is a schematic diagram illustrating an energy level of the grown-junction type single heterostructure. As will be seen from FIG. 19, only electrons are injected from the n-type trapping region.

In order to utilize the heterojunction effectively, the energy gap in the heterojunction must be more than 3 KT (where, K is the Bolzman constant and T is an absolute temperature). When the x value at the light-emitting portion is 0.05, the x value of the trapping layer must be more than 0.15. The x value of 0.15 is sufficient for the total reflection layer.

Figure 20:
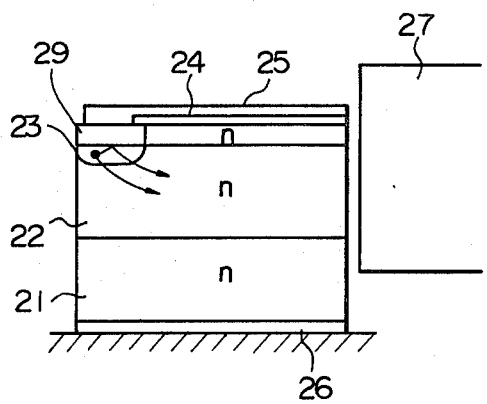
FIG. 20 is a cross sectional view of an LED when its light-emitting portion utilizes the diffused-type single heterostructure, according to another embodiment of the present invention.

FIG. 20 is a cross sectional view of an LED when its light-emitting portion utilizes the diffused-type single heterostructure. Referring to FIG. 20, the numeral 29 represents an n-type $Ga_{1-x}Al_xAs$ crystal layer formed after growing the crystal layer 22. The crystal layer 29 is used as an electron-trapping layer, as well as a reflecting layer as previously mentioned in conjunction with FIG. 13.

Figure 21:
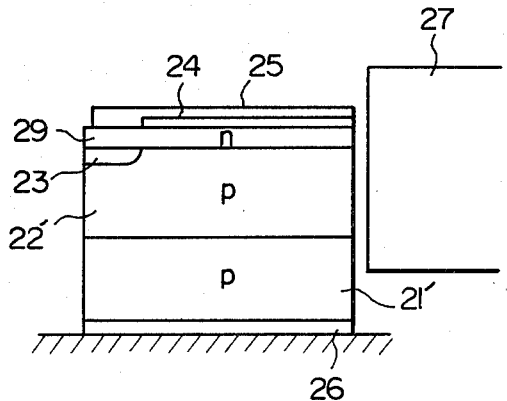
FIG. 21 is a cross sectional view of an LED when its light-emitting portion utilizes the grown-junction type single heterostructure, according to still another embodiment of the invention.

FIG. 21 is a cross sectional view of an LED when its light-emitting portion utilizes the grown-junction type single heterostructure. Referring to FIG. 21, a p-type $Ga_{1-x}Al_xAs$ crystal layer 22' is formed on a p-type GaAs substrate.

In all of the foregoing embodiments, the conduction type may be changed from n to p and from p to n.

From the foregoing description, it will be understood that, according to the present invention, the light-launching efficiency is improved and a large quantity of light can be coupled into an optical fiber without using a spherical-ended fiber.

What is claimed is:

1. A semiconductor light-emitting device comprising: a semicondutor substrate, a $Ga_{1-x}Al_xAs$ crystal layer formed by epitaxial growth on said semiconductor substrate, wherein the x value in said crystal layer is gradually decreased as said epitaxial growth progresses, a light-emitting portion formed where said x value is minimum in said crystal layer, and a light-launching surface at a side surface of said crystal layer, whereby a light ray emitted from said light-emitting portion is bent in accordance with the distribution of said x value to reach said light-launching surface, said semiconductor substrate comprising a groove formed on said semiconductor substrate.

2. A semiconductor light-emitting device as claimed in claim 1, further comprising a rear end surface opposite to said light-launching surface, wherein said groove extends from said light-launching surface to said rear end surface.

3. A semiconductor light-emitting device as claimed in claim 1, wherein said groove has a cross section of a half circle.

4. A semiconductor light-emitting device as claimed in claim 1, wherein the lines along which said x value is constant, within a cross-section of said crystal layer parallel to said light-launching surface, are similar to sectors of concentric circles.

5. A semiconductor light-emitting device as claimed in claim 1, wherein said groove extends from said light-launching surface and terminates approximately beneath said light-emitting portion.

6. A semiconductor light-emitting device as claimed in claim 1 or 5, wherein a reflection layer is provided on said crystal layer.

7. A semiconductor light-emitting device as claimed in claim 1 or 5, further comprising a reflection layer, parallel and opposite to said light-launching surface, on said crystal layer.

8. A light-emitting diode, comprising:
a substrate, said substrate being formed to include a groove in the surface thereof;
a semiconductor epitaxial layer formed atop siad substrate above said groove therein, said epitaxial layer comprising a progressively graded composition such that the refractive index of said epitaxial layer is progressively higher at increasing distances within said epitaxial layer from said substrate; and
a semiconductor light-emitting region, formed above said groove within a region of said epitaxial layer where the refractive index of said epitaxial layer is highest, said light-emitting region and said epitaxial layer having respectively opposite conductivity types.

9. The diode of claim 8, further comprising a light-launching surface, said light-launching surface transecting said epitaxial layer across the surfaces of constant refractive index defined by said progressively graded composition of said epitaxial layer.

10. The diode of claim 9, further comprising means, above said highest-refractive-index region of said epitaxial layer, for reflecting light.

11. The diode of claim 10, further comprising a reflecting surfae transecting said epitaxial layer, said reflecting surface being parallel to said light-launching surface, and said light-emitting region being located between said light-launching surface and said reflecting surface.

12. The diode of claim 10, wherein said groove formed in said substrate includes an end, and said light-emitting region is located above said end of said groove.

13. The diode of claim 8, 9, 10, 11, or 12, wherein said epitaxial layer is approximately 50 microns thick, and wherein said light-emitting region is approximately 100 microns from said light-launching surface.

14. The diode of claim 8, 9, 10, 11, or 12, wherein said means for reflecting light comprises a thin layer of a material having a low index of refraction.

15. The diode of claim 8, 9, 10, 11, or 12, wherein said means for reflecting light comprises a transparent layer of an insulating material, and a layer of a reflecting material above said layer of insulating material.

16. The diode of claim 15, wherein said layer of reflecting material comprises a metallic electrode which is electrically connected to said light-emitting region.

17. The diode of claim 8, 9, 10, 11, or 12, wherein said light-emitting region forms a heretojunction with said epitaxial layer.

18. The diode of claim 12, wherein said epitaxial layer comprises $Ga_{1-xl}Al_xAs$, x being at least 0.05, and x being highest adjacent to said substrate, lowest in said region of highest refractive index, and progressively graded therebetween.

19. The diode of claim 18, wherein said epitaxial layer is doped n-type, and wherein said light-emitting region comprises GaAlAs doped p-type.

20. The diode of claim 19, wherein said light-emitting region is formed from said highest-refractive-index region of said epitaxial layer by addition of a large concentration of zinc.

21. The diode of claim 8, 9, 10, 11, 12, 18, or 20, wherein the cross-section of said groove is rounded.

* * * * *

UNITED STATES PATENT AND TRADEMARK OFFICE
CERTIFICATE OF CORRECTION

PATENT NO. : 4,354,199

DATED : October 12, 1982

INVENTOR(S) : Osamu Hasegawa et al.

It is certified that error appears in the above-identified patent and that said Letters Patent is hereby corrected as shown below:

Front page, after "[22] Filed: Aug. 29, 1980" insert --[30] Foreign Application Priority Data - August 31, 1971 [JP]........54-111159 --.

Col. 5, line 64, "$\sin\phi'_r$" should be --$\sin\phi_r'$--;

Col. 7, line 8, after "radiation" insert --angle--;

line 26, "againt" should be --against--;

Col. 9, line 39, "luanching" should be --launching--;

Col. 11, line 54, "siad" should be --said--;

Col. 12, line 18, "surfae" should be --surface--;

line 44, "$Ga_{1-x1}Al_x As$" should be "$Ga_{1-x}Al_x As$--.

Signed and Sealed this

Twenty-eighth Day of June 1983

[SEAL]

Attest:

GERALD J. MOSSINGHOFF

*Attesting Officer*  *Commissioner of Patents and Trademarks*

UNITED STATES PATENT AND TRADEMARK OFFICE
CERTIFICATE OF CORRECTION

PATENT NO. : 4,354,199
DATED : October 12, 1982
INVENTOR(S) : Osamu Hasegawa et al.

It is certified that error appears in the above-identified patent and that said Letters Patent is hereby corrected as shown below:

Front page, after "[22] Filed: August 29, 1980" insert --[30] Foreign Application Priority Data - August 31, 1979 [JP]........ 54-111159-- instead of "[30] Foreign Application Priority Data - August 31, 1971 [JP........ 54-111159"

Signed and Sealed this

Third Day of April 1984

[SEAL]

Attest:

GERALD J. MOSSINGHOFF

Attesting Officer

Commissioner of Patents and Trademarks